(12) United States Patent
Mirbedini et al.

(10) Patent No.: US 6,864,152 B1
(45) Date of Patent: Mar. 8, 2005

(54) FABRICATION OF TRENCHES WITH MULTIPLE DEPTHS ON THE SAME SUBSTRATE

(75) Inventors: Mohammad R. Mirbedini, Redwood City, CA (US); Venkatesh P. Gopinath, Fremont, CA (US); Hong Lin, Vancouver, WA (US); Verne Hornback, Camas, WA (US); Dodd Defibaugh, Camas, WA (US); Ynhi Le, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 52 days.

(21) Appl. No.: 10/442,533

(22) Filed: May 20, 2003

(51) Int. Cl.[7] .............................................. H01L 21/76
(52) U.S. Cl. ...................... 438/427; 438/700; 438/703; 438/424; 438/749; 438/750; 438/751
(58) Field of Search ................................. 438/424, 427, 438/700, 734, 703, 749–751

(56) References Cited

U.S. PATENT DOCUMENTS

| | | | |
|---|---|---|---|
| 6,171,967 B1 | * | 1/2001 | Jun ............................ 438/700 |
| 6,673,635 B1 | * | 1/2004 | Hellig et al. ................... 438/7 |
| 2003/0077875 A1 | * | 4/2003 | Mandelman et al. ....... 438/424 |

* cited by examiner

Primary Examiner—George Fourson
Assistant Examiner—Thanh V Pham
(74) Attorney, Agent, or Firm—Beyer Weaver & Thomas, LLP

(57) ABSTRACT

Dual trench depths are achieved on the same wafer by forming an initial trench having a depth corresponding to the difference in final depths of the shallow and deep trenches. A second mask is used to open areas for the deep trenches over the preliminary trenches and for the shallow trenches at additional locations. Etching of the shallow and deep trenches then proceeds simultaneously.

10 Claims, 5 Drawing Sheets

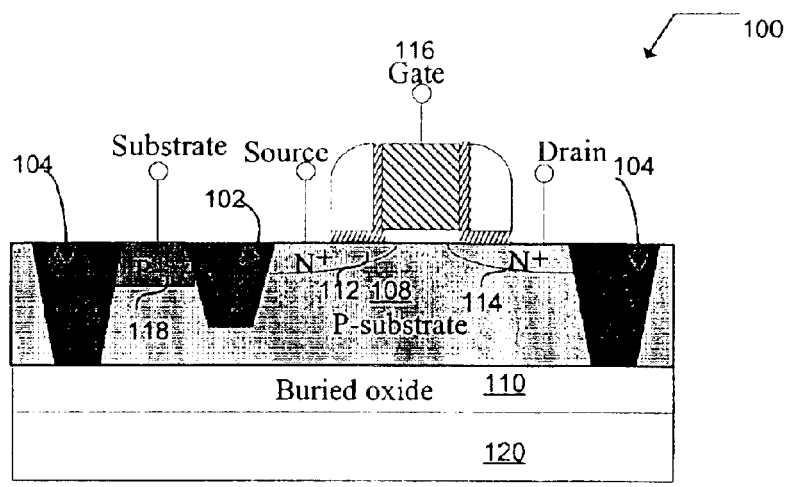
FIG.1
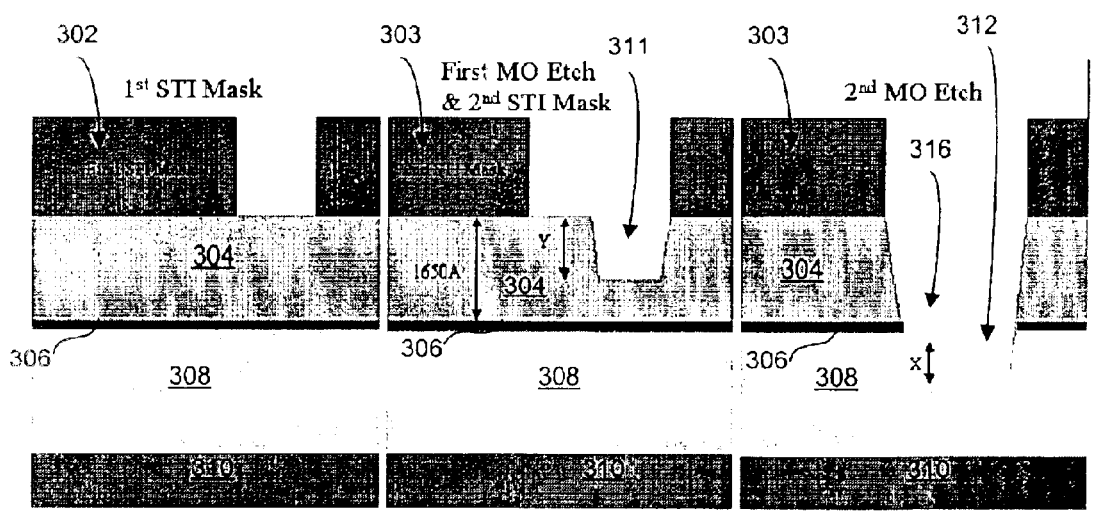
FIG.3A  FIG.3B  FIG.3C

FABRICATION OF TRENCHES WITH MULTIPLE DEPTHS ON THE SAME SUBSTRATE

BACKGROUND OF THE INVENTION

1. Field of the Invention

The present invention relates to methods for fabricating integrated circuits with trenches. More particularly, the present invention relates to methods for forming trenches with multiple depths to isolate active device areas on SOI fabricated semiconductor wafers.

2. Description of the Related Art

Semiconductor wafer fabrication involves a series of processes used to create semiconductor devices and integrated circuits (ICs) in and on a semiconductor wafer surface. Fabrication typically involves the basic operations of layering and patterning, together with others such as doping, and heat treatments. Layering is an operation used to add thin layers of material (typically insulator, semiconductor or conductor) to the surface of the semiconductor wafer. Patterning is an operation that is used to remove specific portions of the top layer or layers on the wafer surface.

Conventional or bulk semiconductor devices are formed in semiconductor material by implanting a well of either P-type or N-type conductivity in a silicon substrate wafer of the opposite conductivity. Gates and source/drain diffusions are then manufactured using commonly known processes. These form devices known as metal-oxide-semiconductor (MOS) field effect transistors (FETs). When a given chip uses both P-type and N-type, it is known as a complimentary metal oxide semiconductor (CMOS). Each of these transistors must be electrically isolated from the others in order to avoid shorting the circuits.

In order to deal with the junction capacitance and "off state" leakage problem as well as obtain reduced size, semiconductor-on-insulator technology (SOI) has emerged. This technology constructs silicon devices, such as transistors, on a thin Si film formed on an insulative substrate rather than on a conventional silicon substrate. Silicon-on-insulator technology provides superior electrical isolation between adjacent components, reduces junction capacitance, and reduces the power consumption.

SOI wafers may be formed in various ways including from a bulk silicon wafer by using conventional oxygen implantation techniques to create a buried oxide layer at a predetermined depth below the surface of the silicon. The implanted oxygen oxidizes the silicon into insulating silicon dioxide in a normal distribution pattern centered at the predetermined depth to form the buried oxide layer. MOSFET (metal oxide semiconductor field effect transistors) transistors formed on SOI substrates also may be able to achieve higher speed operation with higher drive currents, when compared with MOSFETs formed on conventional bulk silicon substrates. One problem with forming field effect transistors on an SOI wafer is the floating body effect. That is, isolation structures extending to the insulating layer prevent the various devices on the substrate from making contact with the body of the substrate.

Isolation structures, which are areas that prevent the active devices from interfering with each other, are important for device operation. A variety of techniques have been developed to isolate devices in integrated circuits including shallow trench isolation (STI) and conventional LOCOS isolation. Shallow trench isolation (STI) is more predominant for deep sub-micron technology, because it is free from bird's beak encroachment, field oxide thinning and leakage due to punch through.

In conventional CMOS technology shallow trenches are used to isolate devices partially from each other while allowing the body contact to all the devices. However, in SOI-CMOS technology the trench isolation completely separates devices from each other and does not permit a body contact. In order to partially implement and benefit from some of the SOI technology's advantages, deep trenches can be formed to completely isolate some of the devices from the others (e.g., NMOS from PMOS), while a shallower trench is used for lateral isolation of the device junctions. This configuration still leaves a connection path to the device substrate and permits implementation of transistors on SOI substrate with a weak body tie.

Unfortunately, creation of two different trench depths on the same substrate is problematic. One conventional method creates two different trench depths for the above purpose by first patterning and etching one trench depth in the substrate followed by another patterning and etch step to define the second trench depth in the locations required for complete isolation. However, patterning the second trench after defining the first trench is difficult, especially if the two trenches are contiguous or overlap. Significant topography variation between the depth of the first trench and the surface of the substrate makes resist coverage difficult. The variation in the resist layer thus makes lithographic printing for the second trench difficult. Moreover, alignment between layers using alignment marks is very difficult while fabricating dual trenches in this manner. The presence of the photoresist interferes with alignment of the second layer relative to the first layer because the non-planar resist diffracts the incoming light causing an apparent shift in the alignment mask position.

Unfortunately, there is no conventional process that is currently specifically capable of overcoming the alignment and patterning issues in a satisfactory manner. Accordingly, what is needed is an improved process for formation of dual trench depths to completely isolate an individual or a group of devices from others while allowing a partial body contact to devices in SOI technology and which further provides inter layer alignment capabilities.

SUMMARY OF THE INVENTION

To achieve the foregoing, the present invention provides methods for fabrication of trenches with two or more depths on the same substrate. A stack having a pad oxide layer and a nitride (silicon nitride—$Si_3N_4$) layer is formed on the substrate. The wafer stack is covered with a resist layer and exposed with a first mask to form a preliminary trench. Using the mask, the preliminary trench is etched in the nitride film to a first depth corresponding to the location of the deep trenches and its depth corresponding to the difference in trench depth of the shallow and deep trenches. A second photoresist layer is formed over the shallow trench. A second mask is used to pattern the photoresist to correspond to the locations of the shallow and deep trenches. By forming the trenches in this manner, dual depths of trench may be created on the same wafer while minimizing the topography variations during processing.

In this approach, rather than etching one trench into the substrate completely, only the depth difference between the two trenches is etched into the substrate in the deeper trench areas (or etching the corresponding silicon nitride thickness equivalent to the etch difference between the two trench depths in a silicon substrate). By using this approach, the overlapping of the areas with two different trench depths doesn't cause any significant etch problems. Moreover, lithography complications caused by the topography variations will be reduced significantly.

Thus, in accordance with various embodiments of the invention, trench isolation is performed by forming an oxide layer on the surface of a semiconductor substrate, followed by deposition or formation of a nitride layer. A preliminary trench is formed in the nitride layer by using a first patterned photoresist mask, the depth of the preliminary trench selected to correspond to the depth differential between the shallow and deep trenches formed in the final structure. A second photoresist mask is formed and used to extend the preliminary trench to a second depth (i.e., a deep trench) and to form shallow trenches (i.e., a third trench) to a third depth in the substrate. The depth of the preliminary trench is derived from the desired differential in depth of the second and third depth and the different etching rates in various materials comprising the substrate.

According to another embodiment of the present invention, a removable alignment mark is formed from one or more of the preliminary trenches. This alignment mark is removed in a subsequent step by planarization in one embodiment, after completion of formation of shallow and deep trenches.

According to yet another embodiment, a dual damascene interconnect structure is formed by defining a preliminary via hole in a nitride layer by using a first patterned photoresist mask, the depth of the preliminary via hole selected to correspond to the depth differential between the depth of the via and the depth of the trench formed in the final structure. A second photoresist mask is formed and used to extend the via to a second depth (i.e., to contact an underlying metal line) and to form shallow trenches (i.e., a third trench) to a third depth in the substrate. The depth of the preliminary trench is derived from the desired differential in depth of the completed via and trench structure and the different etching rates in various materials comprising the substrate.

These and other features and advantages of the present invention are described below with reference to the drawings.

BRIEF DESCRIPTION OF THE DRAWINGS

Further advantages of the invention maybe obtained by reference to the detailed description together with the figures. The figures provided are not to scale so as to more clearly show details of the invention. Like reference numbers indicate like elements throughout the several views.

FIG. 1 is a diagrammatic cross-sectional view of a dual trench isolation structure for SOI-MOS integrated circuit devices formed in accordance with one embodiment of the present invention.

FIGS. 3A–3C are diagrams illustrating steps in performing an etch rate calculation in accordance with one embodiment of the present invention.

DETAILED DESCRIPTION OF PREFERRED EMBODIMENTS

Figure 2A:
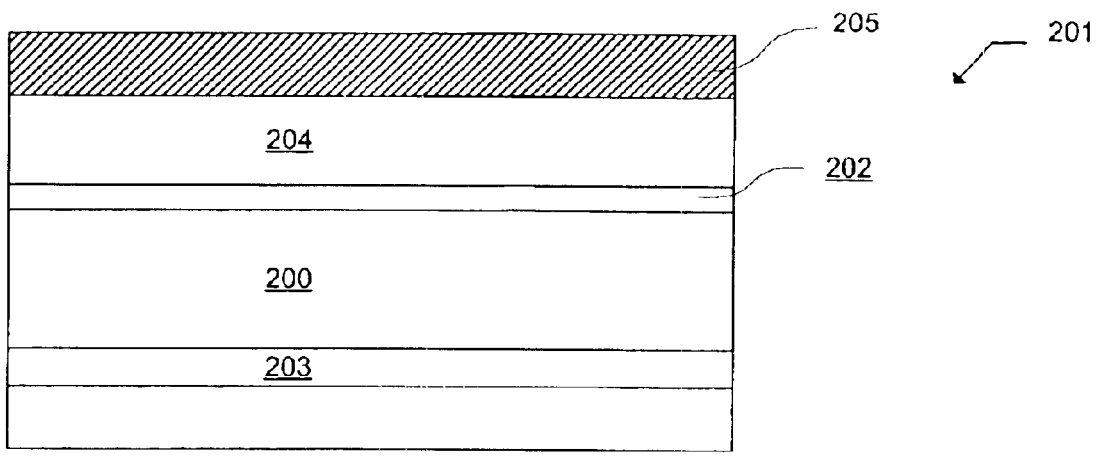
FIGS. 2A–2G are diagrams illustrating stages in the formation of a dual trench isolation structure for SOI-MOS integrated circuit devices formed in accordance with one embodiment of the present invention.

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

This invention offers an approach to achieve multiple trench depths on the same wafer by reducing the topography variations. In this approach, rather than etching one trench into the substrate completely, only the depth difference between the two trenches is etched into the underlying layers in the deeper trench areas. In a preferred embodiment, the initial or preliminary trench, for example, in the silicon nitride, is etched to a depth that is equivalent to the etch difference between the two trench depths in a silicon substrate. By using this approach, the overlapping of the areas with two different trench depths do not cause any significant etch problems. Moreover, lithography complications caused by the topography variations will be reduced significantly.

FIG. 1 is a diagrammatic cross-sectional view of a dual trench isolation structure for SOI-MOS integrated circuit devices formed in accordance with one embodiment of the present invention. Embodiments of the present invention provide improved methods for forming dual trenches on a semiconductor substrate, such as the formation of the shallow trench 102 and deep trenches 104 illustrated in FIG. 1. According to one embodiment, the process may be used to form isolation trenches 102, 104 positioned in a silicon-on-insulator substrate 108.

The isolation of devices formed on a semiconductor substrate has a direct effect on device reliability and basic transistor characteristics. Thus, effective device isolation techniques are important in the development of devices. Inadequate device isolation causes leakage current and results in a loss of power supplied to a semiconductor chip. Inadequate isolation also increases the occurrence of latch-up and causes temporary or permanent damage to the functions of semiconductor devices. It can also lead to degradation of a noise margin, threshold voltage shift, and/or cross talk.

Shallow isolation trenches are typically used to provide isolation and are formed by a series of steps to etch and fill the trench. For example, according to conventional techniques, a semiconductor substrate is etched using a trench etch mask to form a trench. The trench is then filled with a chemical vapor deposition (CVD) layer to provide a device isolation layer. Next, the CVD layer is planarized and the trench etch mask is removed. But formation of both shallow and deep trenches is required to provide full and partial isolation when devices are formed on SOI substrates. It should be noted that the term shallow trench as used herein is generally in reference to a trench of lesser depth than a deep trench, for example, the shallow trench used in isolation structures to provide partial isolation and the deep trench used to provide full isolation. However, the invention is not limited to isolation structures and therefore the use of shallow and deep refers to relative depths and is not limited to isolation structures.

In the semiconductor structure 100 illustrated in FIG. 1, the deep trenches 104 extend from the surface of the substrate 108 to the insulator region 110, here the buried oxide layer. Hence, complete electrical isolation is provided to separate the device defined by source 112, drain 114, and gate 116 from adjacent devices (not shown). Further, the formation of shallow trench 102, extending from the surface of the substrate 108 to a depth above but short of the buried oxide layer 110 enables a body contact 118 to form an electrical connection to the substrate 108. As is known to those of skill in the relevant art, the buried oxide layer 110 may be formed by implanting an oxide layer in a silicon layer or by other means to provide an insulation layer 110 between the device substrate 108 and the bulk silicon layer 120 underlying the insulator layer 110.

The above-described conventional method for forming dual isolation is saddled with problems such as providing uniform resist coverage in the trenches. That is, patterning the second trench after defining the first trench is difficult, especially if the two trenches are contiguous or overlap. Significant topography variation between the depth of the first trench in the conventional method and the surface of the substrate makes the resist coverage difficult and makes lithographic printing for the second trench difficult. The embodiments of the present invention solve these problems by defining in a first step a preliminary trench having a depth corresponding to the difference in depths between the shallow trench and the deep trench and then simultaneously forming the shallow trench and extending the preliminary trench to form the deep trench.

Moreover, alignment problems are solved by using the preliminary trench of the present invention for alignment of the second patterning mask. That is, using conventional methods, alignment of successive layers is very difficult due to the depth of the shallow trenches into the silicon substrate. Embodiments of the present invention allow removable alignment targets for the second trench without degrading subsequent layer alignment capability.

FIGS. 2A–2G are diagrams illustrating stages in the formation of a dual trench isolation structure for SOI-MOS integrated circuit devices formed in accordance with one embodiment of the present invention. The fabrication process begins, as shown in FIG. 2A, with the formation of a thin pad oxide 202 layer on top of a silicon substrate 200 of a wafer 201. The pad oxide 202 may be formed, for example, by thermal processing or in other ways well known to those of skill in the art, and may have a thickness of about 50 to 500 Å.

Figure 2B:
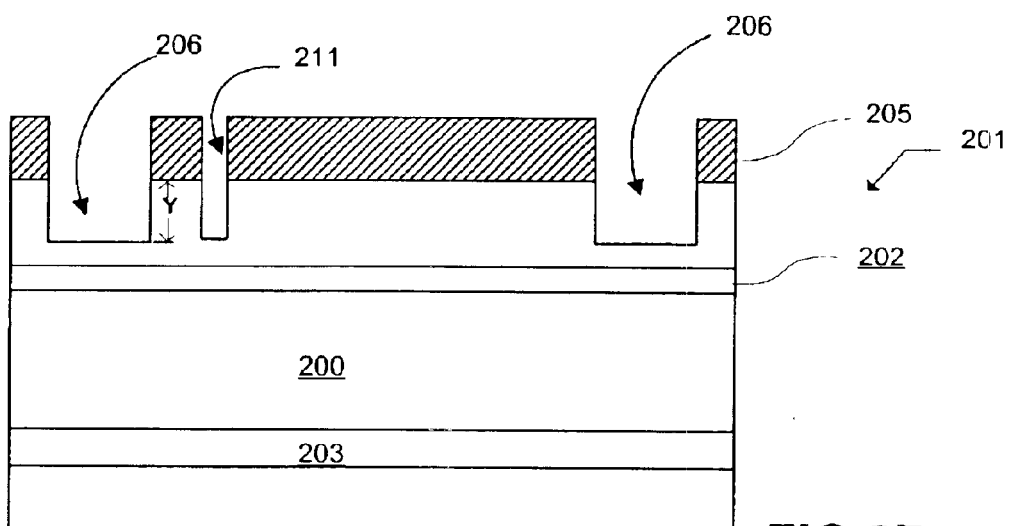

Formation of the pad oxide 202 is followed by a nitride deposition to form a nitride layer 204. For example, the nitride deposition may be performed using a LPCVD (low pressure chemical vapor deposition) process which results in deposition of about 300 to 10,000 Å, preferably about 1000 to 2000 Å, of nitride 204 on top of the pad oxide layer 202. Photolithography techniques are used to transfer a pattern from a reticle to the photoresist layer 205 to form a first mask 205 as shown. The nitride layer 204 is patterned and etched with the first mask 205 so formed, i.e., the "deep" trench mask, to form a preliminary trench 206, as illustrated in FIG. 2B.

Preferably, the preliminary trench 206 has a depth "Y" which is a function of the difference in depths between the shallow trenches and deep trenches to be formed in the silicon substrate 200. The preliminary trench 206 may be formed in the open areas of the first photoresist mask 205 preferably by etching using a high density plasma etch tool based-on HBr, O2, or Cl chemistry or any other similar chemistries. The preliminary trench depth Y may range from a minimal depth to nearly the full depth of the nitride layer. This differential depth ("Y") is preferably determined by the difference in trench depth requirement of the completed shallow and deep trenches. This in turn is dependant upon the etch rate selectivity between the nitride etch with respect to the underlying pad oxide and silicon. In other words, the preliminary trench 206 depth may be derived from the difference in trench depth requirements between the shallow and deep trenches (e.g., requirements relating to electrical performance and isolation) and evaluating the etching chemistries selected and the layers to be etched by each. The preliminary trench depth so determined is the nitride equivalent to the trench depth differential of the final shallow and deep trench structures in the silicon layer.

This step may also be used to create a sacrificial alignment mark 211 for alignment of the shallow trench mask (i.e., "second" mask) in a later step. The sacrificial alignment mark 211, due to the use of the same etch chemistry and its formation in the same etching step as the preliminary trench 206, will have a depth about the same as the depth of the preliminary trench 206 but will not be "opened" during subsequent etching steps. Rather, the alignment mark will be protected by the second (i.e., shallow) patterned trench photoresist mask.

Figure 2C:
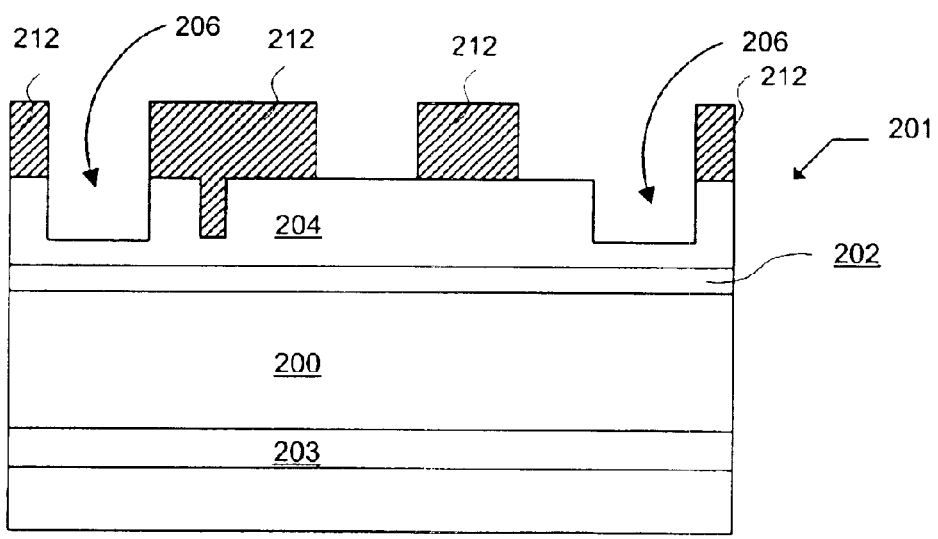

Next, as illustrated in FIG. 2C, the wafer is exposed with the "shallow" trench mask 212. This second mask 212 opens up other locations in addition to the already partially etched deep trench areas, i.e., the "preliminary trenches". That is, where the second mask opens up locations coinciding with the preliminary trenches formed by the first mask, i.e., the "deep" trench mask, a deep trench will be formed. Preferably, the shallow trench mask is aligned to the pattern formed by the deep trench mask using the above fabricated alignment mark 211. Preliminary trenches 206 not "opened" by the "shallow" trench mask 212 preferably will be used as alignment marks 211 and will later be removed entirely by the chemical-mechanical polishing or other planarizing operation.

Alignment marks 211 are suitable for use in alignment of the second mask because they provide reflectivity for detection by optical detectors and may be configured with patterns and widths optimized for such application. That is, the alignment marks 211, having either nitride or pad oxide at the bottom of the preliminary trenches are sufficiently reflective to function as alignment marks. Alignment is commonly performed using optical sensors sensitive to changes in topography or reflectivity. Hence, the exposed nitride or oxide surface is sufficiently reflective to be used as a sacrificial alignment mark according to embodiments of the present invention. In contrast, according to the above-described conventional method of forming dual depth trenches, the shallow trench formed using a first mask extends into the silicon which provides insufficient reflectivity to be used as an alignment mark.

Figure 2D:
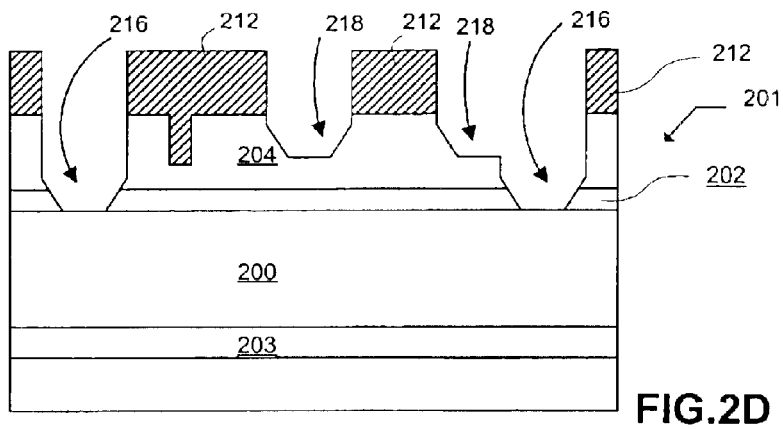

As illustrated in FIG. 2D, the "shallow" trench mask 212 is used to etch the nitride layer 204 in a similar manner to the previous etch used to form the preliminary trenches 206. During this step, the preliminary trenches designated for "deep" trench areas are etched further. Etching progresses such that the etching of the preliminary trenches 206 etched initially progresses to reach the pad-oxide layer 202 and subsequently the underlying silicon layer 200 long before the "shallow" trench regions 218 reach the pad oxide 202 and silicon layers 200. Thus, the "head start" in etching depth provided by the preliminary trenches 206 ultimately determines differential in trench depths between "deep" and "shallow" trenches 216 and 218. Once the trench in the shallow trench locations reaches the silicon layer 200, the nitride etch is preferably switched to a silicon etch, with selectivity to oxide, and continued until the desired shallow trench depth is achieved.

Figure 2E:
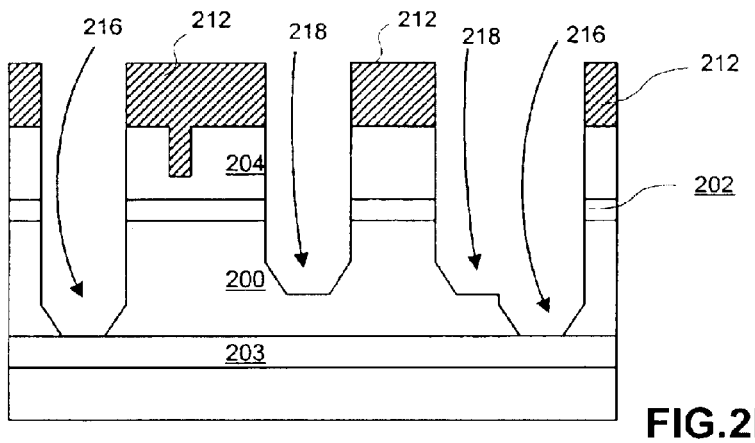

As illustrated in FIG. 2E, etching of the deep trench areas 216 will progress simultaneously with the etching of the shallow trenches 218 in the silicon layer 200 and stop on the bottom buried oxide layer 203.

Figure 2F:
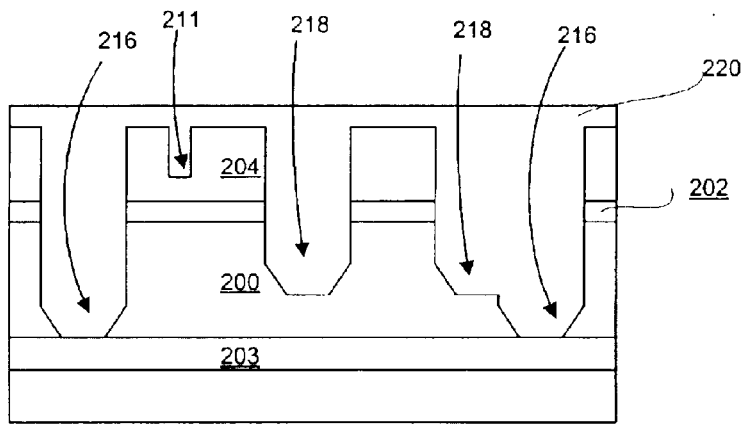

Next, as illustrated in FIGS. 2F, the photoresist layer is removed. At this point an optional oxide liner step may be performed (not,shown) according to conventional methods known to those of skill in the art. That is, formation of the shallow and deep trenches 216 and 218 may be followed by a liner oxidation of the trench sidewalls to form an oxide liner. For example, the oxide liner may be grown under oxygen in a vertical furnace. The oxide thickness may vary from about 50 to 500 Å depending on the technology requirements.

Next, as illustrated in FIG. 2F, the shallow and deep trenches 218 and 216 (as well as the alignment mark 211) are filled with oxide 220, for example, according to an HDP-CVD or APCVD oxide process known to those of skill in the art. The oxide filling enables completion of formation of shallow and deep isolation trenches. For example, an HDP-CVD process may be employed to deposit 3000–8000 Å of oxide to completely fill the trench prior to the CMP (chemical mechanical polishing) process. Alternatively, the trenches may be filled by other methods known to those of skill in the relevant art.

Figure 2G:
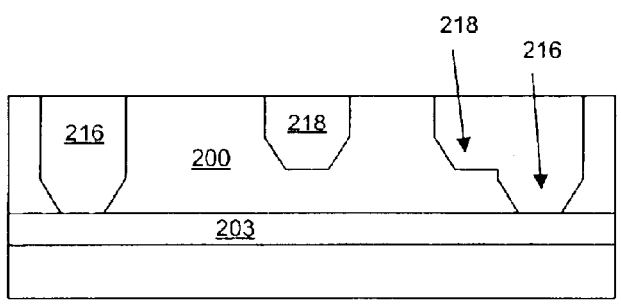

Following oxide deposition, excess oxide 220 and the nitride layer 204 are removed down to the substrate 200 level to form the stack as illustrated in FIG. 2G. This removal may be conducted, for example, by a CMP planarization down to the nitride layer which may subsequently be removed by wet stripping such as by using hot phosphoric acid, according to procedures well known in the art.

Additionally, the surface of the substrate may be provided with a "sacrificial oxide" layer (not shown) that protects the underlying substrate surface. Commonly, the sacrificial oxide layer is formed by thermally oxidizing the silicon of the substrate 200. Typically, the sacrificial oxide layer is formed to a thickness of about 100–150 Å thick.

At this stage, standard processing techniques may be used to complete semiconductor devices, for example, processing to form gate oxide layers and polysilicon gates. The processing described above allows for the deep (i.e., full) trenches to be formed in an STI configuration between devices on a chip to provide complete isolation and the shallow (i.e., partial) trenches to enable providing a body contact and to avoid problems associated with floating body effects. As further illustrated in FIG. 2G, sacrificial alignment marks 211 have been removed by the previous planarization procedures. Although the above isolation trench example contemplates use of a nitride layer over a pad oxide and silicon layer, the invention is not limited to these layers or even etching into multiple layers. The scope of the invention is intended to extend to etching trenches of dual depths into a single layer, such as where the preliminary (first) trench and the following shallow and deep trenches are all formed in a single layer.

FIGS. 3A–3C are diagrams illustrating steps in performing an etch rate calculation in accordance with one embodiment of the present invention. Such an etch rate calculation is preferably used to determine the feasibility of forming a preliminary trench of depth Y in the nitride to result in a desired trench depth differential X in the final structure. Preferably, the depth Y of the preliminary trench 302 is determined after initially selecting a trench depth differential X to represent the difference in trench depths between the shallow trench, such as trench 102 illustrated in FIG. 1, and the deep trench, such as trench 104, also illustrated in FIG. 1.

FIG. 3A illustrates the first STI mask 302, the photoresist forming the mask patterned to correspond to the location of the deep trench (see location 312 in FIG. 3C) and positioned over the nitride layer 304, pad oxide layer 306, silicon substrate 308, and insulator region 310. FIG. 3B illustrates the stack after the mask open etch and the subsequent formation of the second STI mask 303, i.e., for the shallow trench locations and further etching of the deep trench locations. Here Y represents the depth of the preliminary trench 311 etched into the nitride layer 304. For purposes of illustrating the etch trench differential and the initial selected depth Y of the preliminary trench, "ER1" in the following calculations is taken to represent the $Si_3N_4$ (silicon nitride) etch rate, for example, at 2300 Å/min. This same etch rate is assumed for calculation purposes in this example to represent the etch rate in the pad oxide layer. The etch rate in the silicon layer 308 is represented by ER2, and assumed for calculation purposes here to be 1100 Å/min. Thus, the relationship between X and Y for this example can be established by the following:

$$X = Y * ER2/ER1$$

Where ER1=2300 Å/min; ER2=1100 Å/min.
To achieve X=500 Å, we need Y=1045 Å.

Thus, the foregoing relationship establishes that the trench depth differential is easily achievable using the materials and etchants selected. By using the methods of the present embodiment, the topography variation seen by the second photoresist layer and mask is much less than in the conventional case. For example, the topography variation seen by (below) the shallow trench mask is only 1000 Å in the example illustrated compared to a topography variation of 2500 to 3500 Å or more seen by conventional methods (i.e., the full depth of the conventional shallow trenches).

As illustrated in FIG. 3C, the shallow trench 316 will break through into the silicon layer 308 when the depth of the deep trench 312 lies X Å below the top surface of the silicon layer 308. This trench depth differential X will be maintained as both the shallow and deep trenches are progressively etched into the silicon layer 308. In other words, since both the shallow and deep trenches are extended into the same material using the same etchant, the trench differential X will be maintained as etching progresses through this common layer. Further robustness is provided by the existence of the buried oxide layer 310 on the SOI substrate. That is, the silicon etch will exhibit high selectivity between silicon and oxide and thus the buried oxide layer 310 will essentially stop the etching of the deep trench 312, thereby avoiding the need for critical control over the etch times for the deep trench. In a preferred embodiment, endpoint detection means are used to determine the stopping point for the etches.

The foregoing example is intended to be illustrative and not limiting. The scope of the present invention is intended to extend to etching trenches of two or more different depths on a substrate, whether for isolation purposes, damascene interconnect structures, or otherwise. Furthermore, the etch rates described are illustrative only and also not intended to limit the invention to a particular etchant or material layer selection for etching.

According to the techniques of the present invention, the depth of the preliminary trench is derived from the final depth differential desired and by individually evaluating the effect of the common etchant on the progression of each of the shallow and deep trenches. In situations where formation of the trenches takes place in only one material, the preliminary trench depth is equivalent to the trench depth differential between the shallow and deep trenches in the final structure. In one embodiment, the preliminary trench depth may be set to the differential depth between the trenches also where the additional layers constituting different materials to be etched are thin or when the etching rates of the material layers to be etched do not differ appreciably from each other. As illustrated above, once the deep trench progresses to the final silicon layer 308, the etching rate is reduced due to the fact that the etchant had been optimized to remove silicon nitride (and pad oxide). The etchant selected for removal of the nitride layer in the trenches preferably has a substantial non-zero etch rate in the underlying (e.g. silicon) layer. Accordingly, the preliminary trench depth (and hence the initial differential between the bottom of the shallow and deep trenches) is reduced when the nitride etchant extends the deep trench into the silicon layer 308. This example is illustrative and not intended to limit the scope of the invention. A preferred embodiment encompasses progressively selecting etchants optimized (i.e., having higher removal rates for the selected layer as opposed to the other underlying layers) for each material layer encountered as the shallow trench progresses. The changeover to a new etchant preferably occurs when the shallow trench progresses into the underlying layer. This embodiment will usually result in the final trench differential being less than the preliminary trench depth.

According to an alternative embodiment, the progression of the trenches continues, the etchant maybe optimized for the selective removal of the next underlying layer as opposed to the current layer. For example, if the initial etch of the nitride layer is optimized for silicon as opposed to nitride, the preliminary trench depth will yield a greater trench depth differential between the shallow and deep trenches in the final configuration (as compared to the preliminary trench depth) after all etching is completed. Moreover, the scope of the present invention is intended to extend to combinations of these techniques. That is, for example, where multiple layers are being etched to form the trenches, in some cases the etchant may be optimized for the overlying layer and in other case for the underlying layer. The techniques of the present invention recognize that the initial trench depth differential (i.e., the preliminary trench depth) may be modified at any time that a common etchant is applied to both the shallow and deep trenches but the respective trenches are progressing through different materials. Thus, by evaluating the time intervals for the etchant and the different trench etch rates for the respective different materials, the modifications to the trench differential may be determined and the impacts during each interval summed to yield the overall impact.

Using the guidance provided by the embodiments of the present invention, one skilled in the art could be expected, according to the methods described herein, to determine appropriate initial depths of trenches for formation of shallow and deep trenches of various dimension in layers having various thicknesses, material compositions, and using a variety of etchant chemicals having different etching rates.

Figure 4A:
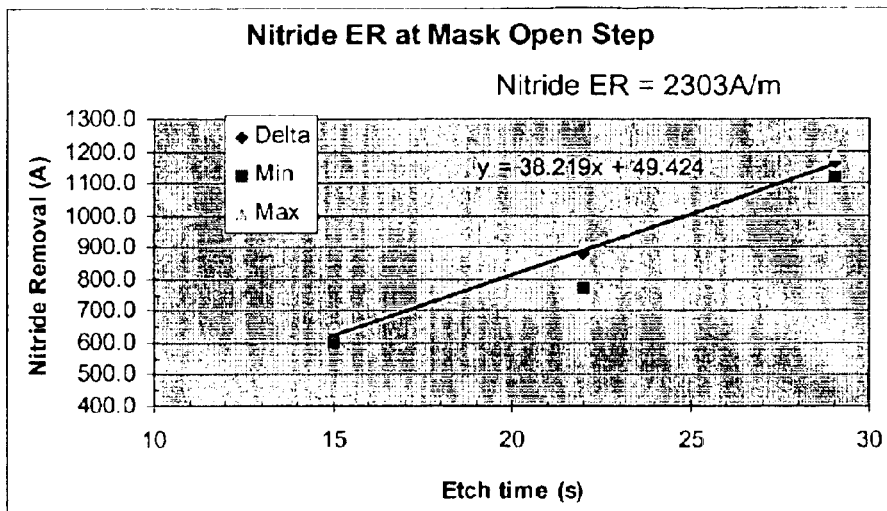
FIGS. 4A–4C are graphs illustrating experimental etch rates of the layers depicted in FIGS. 2A–2G in accordance with one embodiment of the present invention.
Figure 4B:
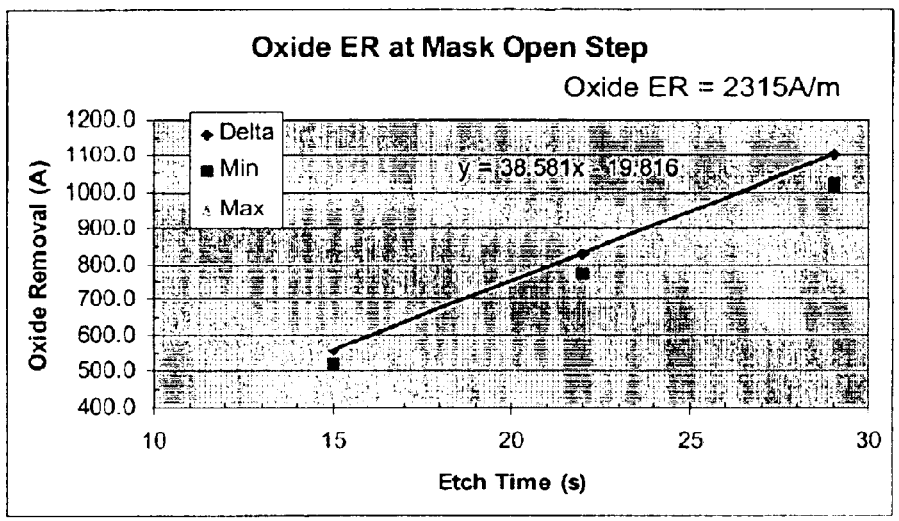
Figure 4C:
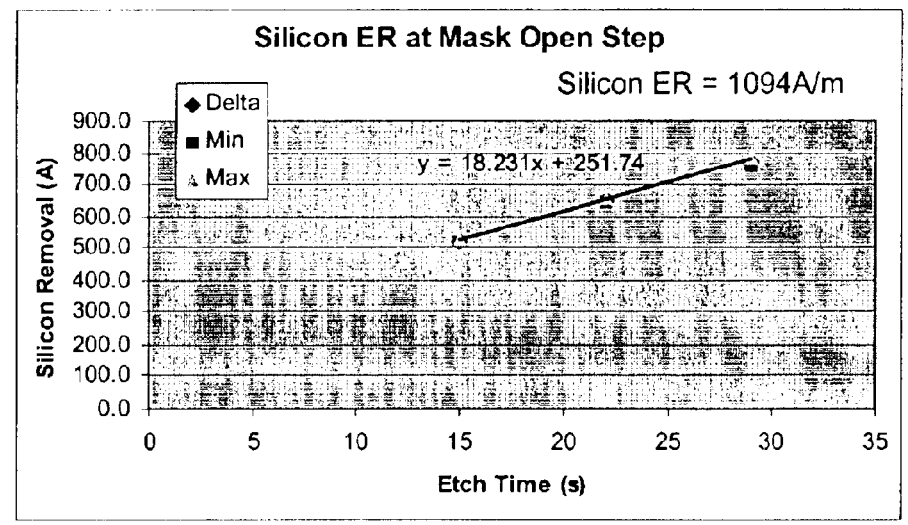

FIGS. 4A–4C are graphs illustrating experimental etch rates of layers such as those depicted in FIGS. 2A–2G in accordance with one embodiment of the present invention. As illustrated in FIGS. 4A and 4B, the etch rates of $Si_3N_4$ and oxides are similar, at 2303 and 2315 Angstroms/min. respectively using a recipe of 8 mTorr pressure, 500 W TCP RF power, 150 W bottom RF power, 40 sccm of $CHF_3$ and 60 sccm of $CF_4$ process gas was used in a LAM TCP9400PTX process chamber. The etch rate illustrated in FIG. 4C, using the same recipe, represents the silicon removal rate at 1094 Angstroms/min., a rate of approximately 50% of the other material removal rates illustrated. Thus, the depth Y of the preliminary trenches needs to be approximately twice that of the desired differential depth (i.e., the differential between the shallow trenches and deep trenches) to achieve the desired dimension of the final structure.

Thus, according to the foregoing, trench isolation is performed by forming an oxide layer on the surface of a semiconductor substrate, followed by deposition or formation of a silicon nitride layer. A preliminary trench is formed in the nitride layer, the depth of the preliminary trench selected to correspond to the depth differential between the shallow and deep trenches. A second mask such as a patterned photoresist layer is then used for simultaneous formation of the deep and shallow trenches in the silicon (or other suitable underlying layer), although to different depths. The final depth of the shallow and deep trenches is determined by the depth of the preliminary trench and the etching rates in the silicon, nitride, and pad oxide layers in this example.

The process techniques described above enable the formation of a weak body connection for electrical performance improvements when the dual depth techniques are applied to the formation of isolation trenches on SOI substrates. That is, an efficient technique is provided for forming partial (i.e., shallow) and full (i.e., deep) trenches to provide device isolation and a body tie on SOI substrates.

Figure 5A:
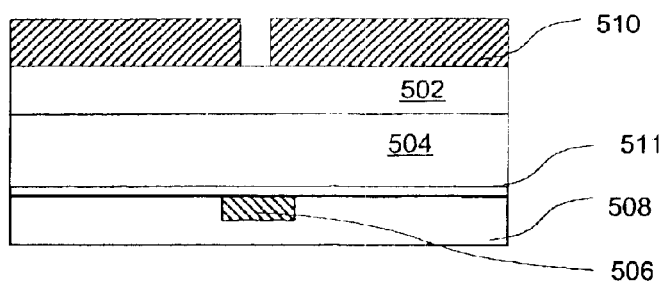
FIGS. 5A–5E are diagrams illustrating stages in the formation of a dual damascene interconnect structure in accordance with one embodiment of the present invention.
Figure 5B:
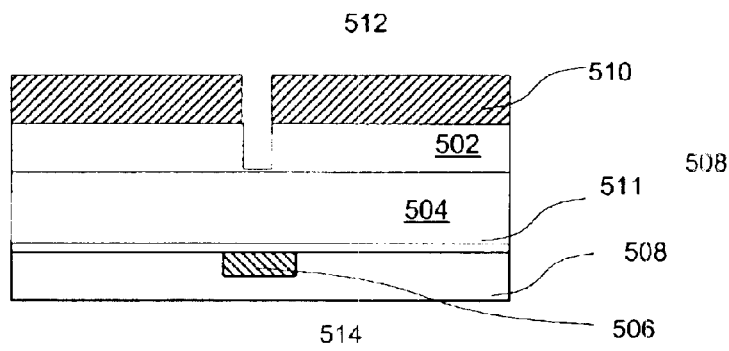
Figure 5C:
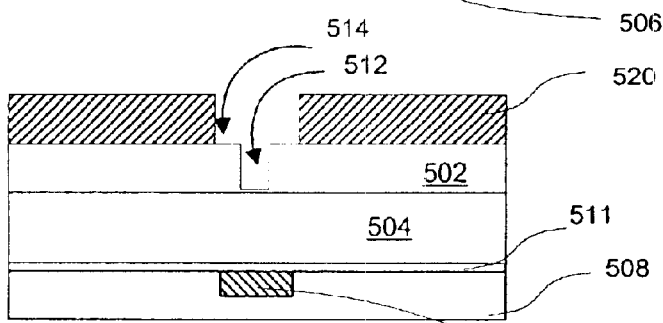
Figure 5D:
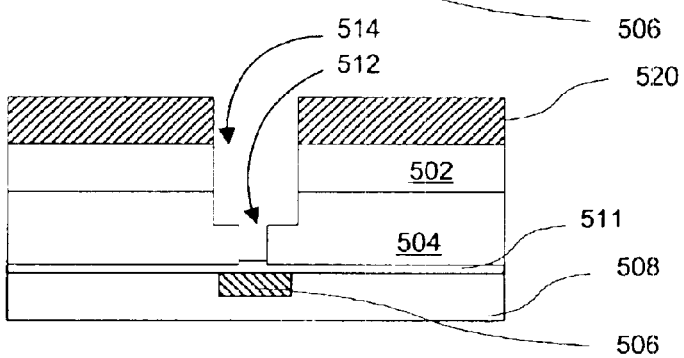
Figure 5E:
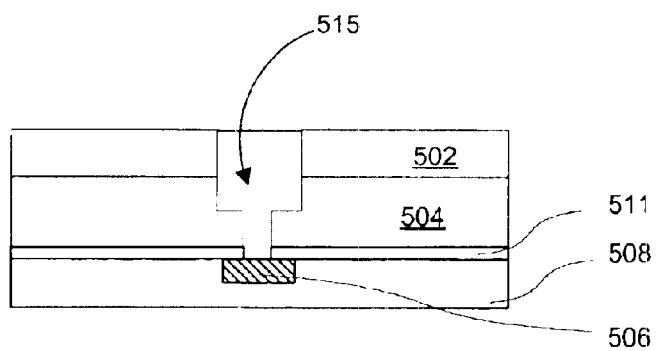

In describing the process techniques as applied to various substrate layers, dimensions have been provided as to the thickness of the layers as well as the various trenches formed. While preferable, these dimensions are not intended to be limiting. Moreover, the materials in which the dual depth trenches of the present invention may be formed are not particularly limited. For example, while not intending to be limiting, the process techniques may be applied to form dual trenches for dual damascene interconnect structures, such as formed in low-k interconnect dielectrics. FIGS. 5A–5E illustrate the stages of forming a dual damascene interconnect structure in accordance with one embodiment of the present invention. The process begins with a low-k interconnect layer 504 formed over metal interconnect line 506 formed in dielectric layer 508. Methods of forming low-k layers and other dielectric layers are known to those of skill in the art and therefore further description is deemed unnecessary here. Low-k interconnects according to conventional methods are provided often with capping layers, such as silicon nitride or silicon carbide layer 502 illustrated. Photoresist layer 510 is shown patterned for providing a mask open area to form a preliminary trench (i.e., via). As illustrated in FIG. 5B, the preliminary trench 512 is etched into the nitride layer to a depth corresponding to the difference in depths between the trench and via in the final configuration. As illustrated in FIG. 5C, the trench mask 520 is formed to define the location of the trench relative to the already formed via 512. Etching of the remaining thickness of the nitride layer 502 and the low-k layer 504 then proceeds to simultaneously form the trench and via The bottom of the via is stopped on the barrier layer 511. Finally, as illustrated in FIG. 5D, a barrier open etch is performed to expose the metal line 506. Conventional copper barrier layer deposition and copper fill steps follow to form the dual damascene interconnect structure in accordance with conventional techniques. By using the guidance provided by the description herein as applied to dual depth isolation layers, the initial depth of the via 512 formed in the nitride layer maybe selected to correspond to the final differences in depths of the trench and via (e.g., relative to the top surface of the low-k layer 504) and thus to form the dual damascene interconnect structure by the novel method described.

Although the foregoing invention has been described in some detail for purposes of clarity of understanding, it will be apparent that certain changes and modifications may be practiced within the scope of the appended claims. For example, the invention has generally been described in relation to the formation of dual trenches in a substrate. The dual trenches are intended to be illustrative and not limiting. That is, the scope and spirit of the invention is intended to extend to multiple trenches using the guidance provided in the specification. For example, fabrication of trenches having three or more depths in the same substrate may be completed by defining the first two ("dual") trenches as described above and extending the first two trenches in the step when the third trench is defined using a third mask. This methodology may likewise be extended beyond three depths for the trenches to any number of multiple depths. Accordingly, the present embodiments are to be considered as illustrative and not restrictive, and the invention is not to be limited to the details given herein, but may be modified within the scope and equivalents of the appended claims.

What is claimed is:

1. A method of forming an isolation structure on an integrated circuit substrate, comprising:

providing a substrate configured so that it includes:
a silicon layer that overlies a buried oxide layer;
a pad oxide layer overlying the silicon layer; and
a nitride layer overlying the pad oxide layer;

forming a first pattern mask over the substrate such that a first pattern of apertures is formed the first pattern mask;

first etching of the nitride layer through apertures defined by the first pattern mask to form a fist set of trenches in the nitride layer having a first depth;

removing the first pattern mask;

forming a second pattern mask over the substrate that defines a second pattern of apertures in the second pattern mask;

second etching of the of the substrate through the apertures defined by the second pattern mask to form a second set of trenches of a second depth in the substrate and to extend the depth of exposed portions of the first set of trenches to a third depth; and third etching of the of the substrate through the apertures defined by the second pattern mask to form to extend the depths of the second set of trenches to a fourth depth and to further extend the depth of exposed portions of the second set of trenches.

2. A method of claim 1 further comprising:

removing the second pattern mask; and filling the openings caused by the first, second, and third etching.

3. A method of claim 1, wherein at least a portion of the apertures of the second pattern mask are not in alignment with the apertures of the first pattern mask.

4. A method of claim 1, wherein filling the openings caused by the first and second etching comprises filling the openings with an electrically insulating material.

5. A method of claim 1, wherein said providing of the substrate includes providing a substrate having a conductive interconnect structure that lies under the buried oxide layer; and wherein the third etching of the of the substrate comprises further extending the depth of exposed portions of the second set of trenches until said trenches extend through the buried oxide layer to expose the conductive interconnect structure.

6. A method of claim 1, wherein said providing of the substrate includes providing a substrate having a conductive interconnect structure that lies under the buried oxide layer; and wherein the third etching of the of the substrate comprises further extending the depth of exposed portions of the second set of trenches until said trenches extend trough the buried oxide layer to expose the conductive interconnect structure.

7. A method of claim 6 further comprising:

removing the second pattern mask; and filling the trenches that extend through the buried oxide layer to expose the conductive interconnect structure with conductive material to enable electrical connection with the conductive interconnect structure.

8. A method of claim 1, wherein said second etching of the of the substrate is accomplished using a first etchant; and said third etching of the of the substrate is accomplished using a second etchant.

9. A method of claim 8, wherein said first etchant has good etch selectivity for silicon nitride; and wherein said second etchant has good etch selectivity for silicon.

10. A method of claim 9, wherein the second etching of the of the substrate proceeds until at least a portion of pad oxide layer is reached; and wherein the third etching of the of the substrate proceeds until at least a portion of buried oxide layer is reached.

* * * * *

UNITED STATES PATENT AND TRADEMARK OFFICE
CERTIFICATE OF CORRECTION

| | |
|---|---|
| PATENT NO. | : 6,864,152 B1 |
| DATED | : March 8, 2005 |
| INVENTOR(S) | : Mirabedini et al. |

It is certified that error appears in the above-identified patent and that said Letters Patent is hereby corrected as shown below:

<u>Title page,</u>
Item [75], Inventor, change "Mohammed R. Mirbedini" to -- Mohammed R. Mirabedini --.

Signed and Sealed this

Nineteenth Day of July, 2005

JON W. DUDAS
*Director of the United States Patent and Trademark Office*